(12) United States Patent
Wang

(10) Patent No.: US 11,217,681 B2
(45) Date of Patent: Jan. 4, 2022

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Nan Wang, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 72 days.

(21) Appl. No.: 16/659,921

(22) Filed: Oct. 22, 2019

(65) Prior Publication Data
US 2020/0212204 A1    Jul. 2, 2020

(30) Foreign Application Priority Data
Dec. 29, 2018   (CN) .......................... 201811637969.4

(51) Int. Cl.
| | | |
|---|---|---|
| H01L 29/66 | (2006.01) | |
| H01L 29/36 | (2006.01) | |
| H01L 21/762 | (2006.01) | |
| H01L 21/033 | (2006.01) | |
| H01L 29/78 | (2006.01) | |

(52) U.S. Cl.
CPC .... *H01L 29/66795* (2013.01); *H01L 21/0337* (2013.01); *H01L 21/76224* (2013.01); *H01L 29/36* (2013.01); *H01L 29/7851* (2013.01)

(58) Field of Classification Search
CPC ............... H01L 29/66795; H01L 29/36; H01L 21/76224; H01L 21/0337; H01L 29/7851; H01L 21/823821; H01L 29/785
See application file for complete search history.

(56) References Cited

U.S. PATENT DOCUMENTS

| | | | |
|---|---|---|---|
| 9,484,202 B1* | 11/2016 | Zhou ..................... H01L 21/311 |
| 2010/0144150 A1* | 6/2010 | Sills ................... H01L 21/31138 |
| | | | 438/694 |

\* cited by examiner

*Primary Examiner* — Su C Kim
(74) *Attorney, Agent, or Firm* — Anova Law Group, PLLC

(57) ABSTRACT

Fabrication method and semiconductor device are provided. The method includes: providing a base substrate including a first region and a second region adjacent to the first region, with first fins disposed on the base substrate in the first region and on the base substrate in the second region, and initial openings disposed between adjacent first fins; forming sidewall spacers on sidewalls of the first fins to form openings from the initial openings; and forming the second fins in the openings of the second region.

19 Claims, 5 Drawing Sheets

SEMICONDUCTOR DEVICE AND FABRICATION METHOD THEREOF

CROSS-REFERENCES TO RELATED APPLICATION

This application claims the priority of Chinese Patent Application No. 201811637969.4, filed on Dec. 29, 2018, the content of which is incorporated herein by reference in its entirety.

TECHNICAL FIELD

The present disclosure generally relates to the field of semiconductor technology and, more particularly, relates to a semiconductor device and its fabrication method.

BACKGROUND

As semiconductor technologies develop rapidly, semiconductor devices are developed toward a direction with a higher device density and a higher integration level. A transistor is one of the most fundamental devices and is widely used. With development of the semiconductor technologies, the controlling ability to a conventional planar transistor on channel current becomes weaker, causing short channel effects and serious leakage current problems. The semiconductor device has a poor performance.

To better alleviate the short channel effects and suppress the leakage currents, fin field-effect transistors (FinFETs) are widely used. A FinFET is a multi-gate device, and usually includes: fins on a surface of a semiconductor substrate; an isolation layer on the surface of the semiconductor substrate covering a portion of sidewalls of the fins and with a top surface lower than top surfaces of the fins; gate structures on the top surface of the isolation layer, on tops of the fins, and on the sidewalls of the fins; and sources and drains in the fins on two sides of each of the gate structures.

However, there is a need to improve the performance of conventionally formed FinFETs. The disclosed methods and semiconductor devices are directed to solve one or more problems set forth above and other problems in the art.

SUMMARY

One aspect of the present disclosure provides a fabrication method for a semiconductor device. The method includes: providing a base substrate including a first region and a second region adjacent to the first region, providing first fins on the first region and on the second region of the base substrate, with initial openings disposed between adjacent first fins; forming sidewall spacers on sidewalls of the first fins in the initial openings, thereby forming openings; and forming a second fin in each opening in the second region.

Another aspect of the present disclosure provides a semiconductor device. The device includes: a base substrate including a first region and a second region adjacent to the first region; first fins on the first region of the base substrate; and second fins on the second region of the base substrate. Each first fin includes a lightly-doped fin layer on the base substrate and a highly-doped fin layer on the lightly-doped fin layer. A distance between adjacent first and second fins is greater than one or more of a distance between adjacent first fins and a distance between adjacent second fin.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
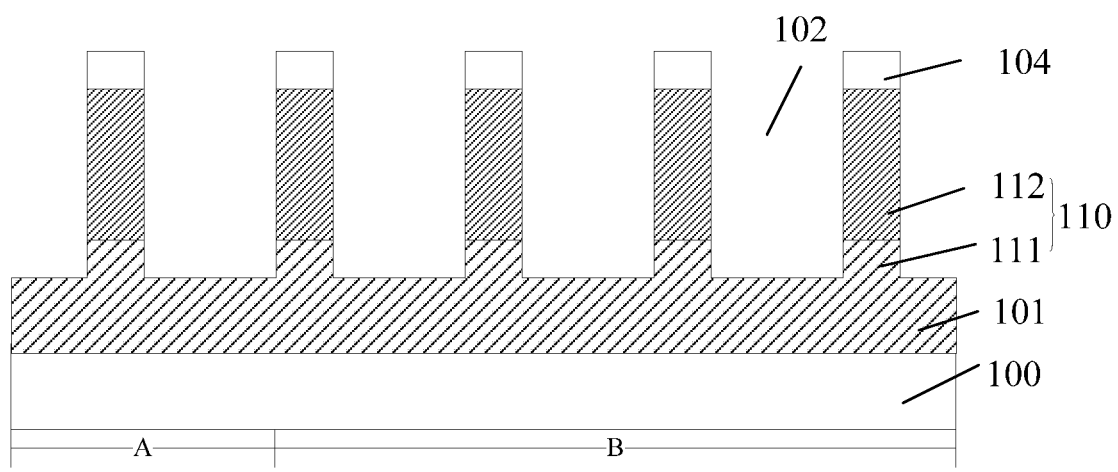
FIGS. 1-8 illustrate semiconductor structures corresponding to certain stages for forming an exemplary FinFET device according to various disclosed embodiments of the present disclosure.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width and depth should be considered during practical fabrication.

A semiconductor device may be formed by: providing a substrate including a first region and a second region adjacent to the first region; forming first fins on the substrate in the first region and in the second region; forming isolation structures on the substrate to cover sidewalls of the first fins; removing a portion of the first fins in the second region to form second openings in the isolation structures; and forming second fins in the first openings.

As the semiconductor technologies develop, different types of devices have to be integrated and devices with different functions have to be formed in different regions. Correspondingly, fins with different functions in different regions are necessary, and the fins in different regions have different size, materials and density. In the above method, the size and density of a portion of the fins in the first region and another portion of fins in the second region have been fixed. It is hard to adjust the size and density according to different functions in different regions.

The present disclosure provides a semiconductor device and fabrication method thereof to at least partially resolved above problems. In the fabrication method, a substrate including a first region and a second region adjacent to the first region may be provided. First fins may be formed on the substrate in the first region and in the second region. Initial openings may be disposed between adjacent first fins. Second fins may be formed between adjacent first fins in the second region. Correspondingly, the fins in the second region may have a higher density and a fin array with a high density may be achieved. A performance of a formed semiconductor device may be improved.

Figure 7:
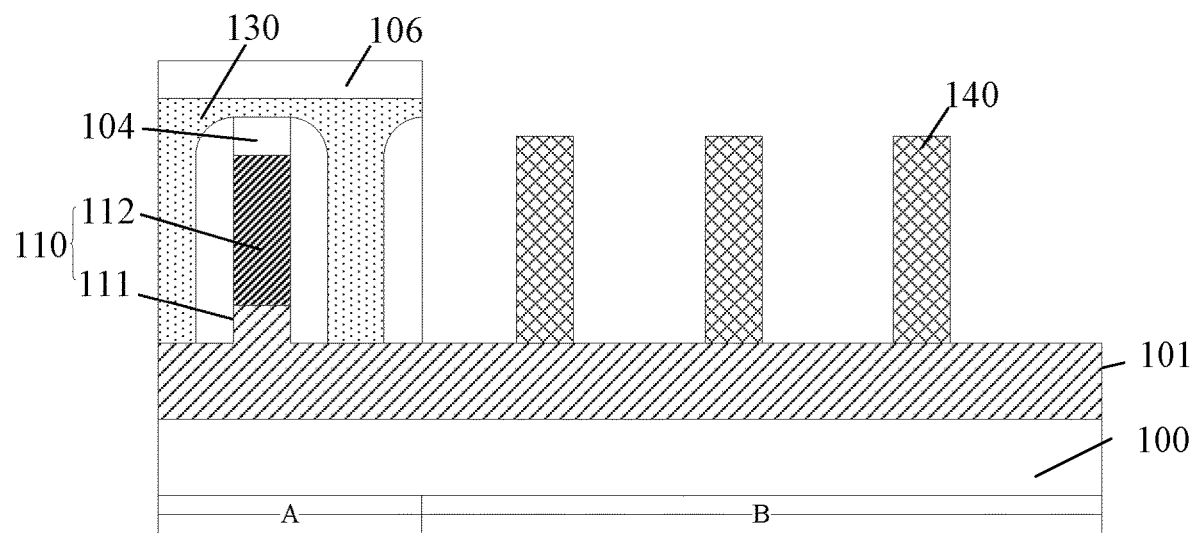
Figure 8:
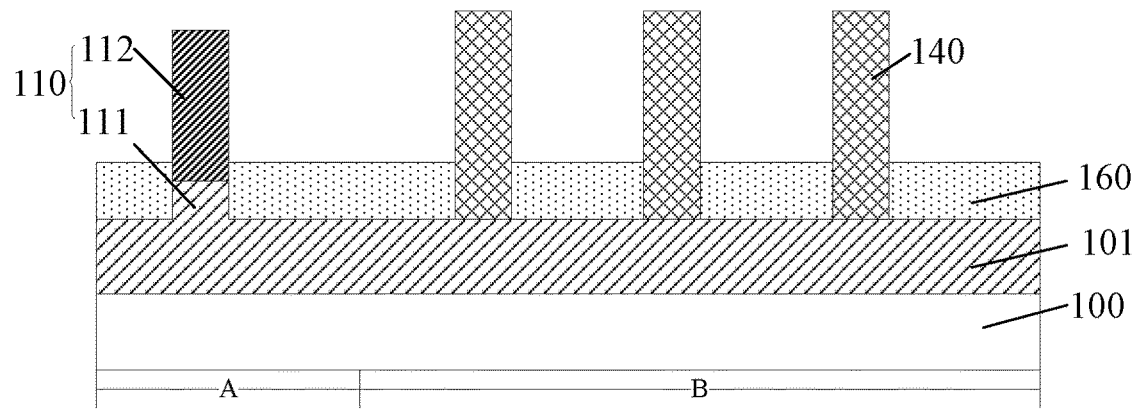
Figure 9:
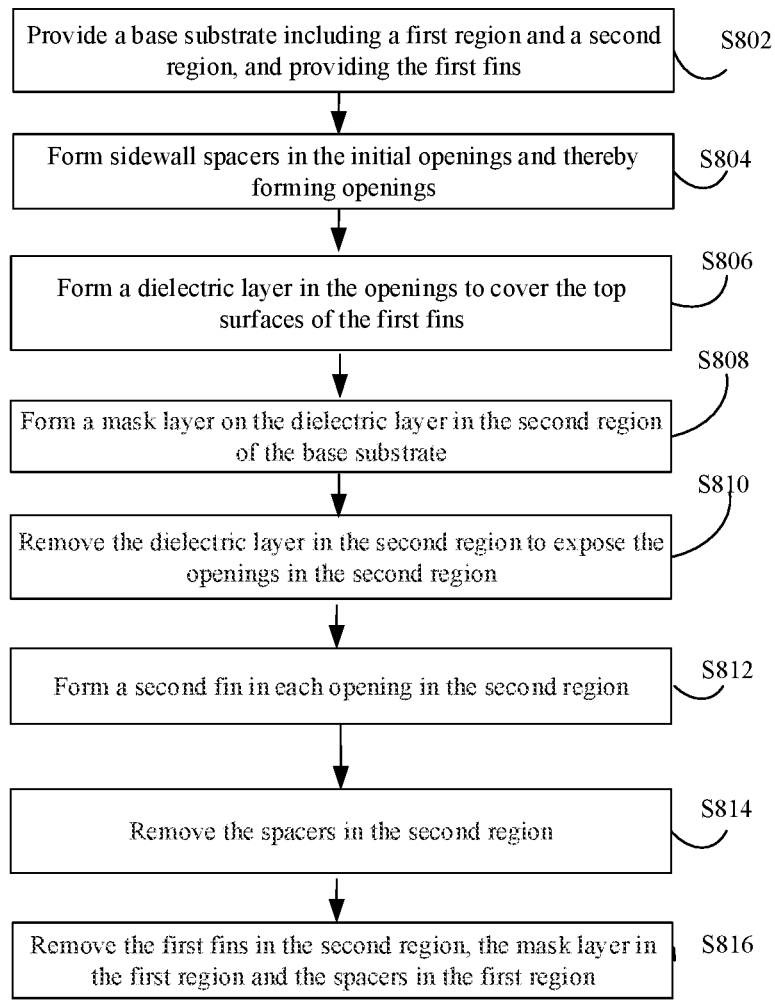
FIG. 9 illustrates an exemplary method for forming a FinFET device according to various disclosed embodiments of the present disclosure.

FIGS. 1-8 illustrate semiconductor structures corresponding to certain for forming a FinFET device according to various disclosed embodiments of the present disclosure, and FIG. 9 illustrates an exemplary method for forming a FinFET device according to various disclosed embodiments of the present disclosure.

As illustrated in FIG. 1, a base substrate may be provided (e.g., Step S802 in FIG. 9).

In one embodiment, the base substrate may include a semiconductor substrate 100 and first fins on a surface of the semiconductor substrate 100. In other embodiments, the base substrate may be a planar substrate.

In one embodiment, the semiconductor substrate 100 may include a first region A and a second region B. The first region A may be adjacent to the second region B. The first fins 110 may be disposed on the semiconductor substrate 100 in the first region A and in the second region B respectively. Initial openings 102 may be formed between adjacent first fins 110.

In one embodiment, the first region A may be used to form P-type transistors and the second region B may be used to form N-type transistors. In other embodiments, the first region A may be used to form N-type transistors and the second region B may be used to form P-type transistors.

In one embodiment, the semiconductor substrate 100 may be made of single-crystalline silicon. In some other embodiments, the semiconductor substrate 100 may be made of polycrystalline silicon and/or amorphous silicon. In some other embodiments, the semiconductor substrate 100 may be made of a semiconductor material including germanium, SiGe, GaAs, or a combination thereof. In some other embodiments, the semiconductor substrate 100 may be a semiconductor-on-insulator structure. The semiconductor-on-insulator structure may include an insulator and a semiconductor layer on the insulator. The semiconductor layer may be made of a semiconductor material including silicon, germanium, SiGe, GaAs, or a combination thereof.

In one embodiment, the first fins 110 may be formed by: forming a fin material layer on the semiconductor substrate and patterning the fin material layer to form the first fins 110.

In some embodiments, the fin material layer may include a lightly-doped fin material layer 101 and a highly-doped fin material layer on a surface of the lightly-doped fin material layer 101.

The first fins 110 may be formed by: forming a lightly-doped fin material layer on the semiconductor substrate; forming a highly-doped fin material layer on a surface of the lightly-doped fin material layer 101; forming a pattern layer on the highly-doped material layer; and etching the lightly-doped fin material layer 101 and the highly-doped fin material layer to form the first fins 110 by using the pattern layer as a mask.

The lightly-doped fin material layer 101 may be made of silicon doped with germanium where a molar volume percentage of germanium may be about 10% to about 30%.

The highly-doped fin material layer may be made of silicon doped with germanium where a molar volume percentage of germanium may be about 20% to about 100%.

Each of the first fins 110 may include a lightly-doped fin layer 111 and a highly-doped fin layer 112 on the lightly-doped fin layer 111.

In one embodiment, initial openings 102 may be formed between adjacent first fins 110. The initial openings 102 may expose the lightly-doped fin material layer 101.

In some other embodiments, the initial openings 102 may expose the semiconductor substrate 100.

The initial openings 102 may provide spaces for forming openings later.

The initial openings 102 may have a width of about 15 nm to about 50 nm.

In one embodiment, a barrier layer 104 may be formed on a top of each first fin 110. The barrier layers 104 may protect the first fins 110 when forming the first fins 110 by etching and protect top surfaces of fins in the second region when removing a dielectric layer.

The barrier layers 104 may be made of SiN, SiNC, SiNB, SiNCO, SiNO, or a combination thereof.

In one embodiment, the barrier layers 104 may be made of SiN.

Figure 2:
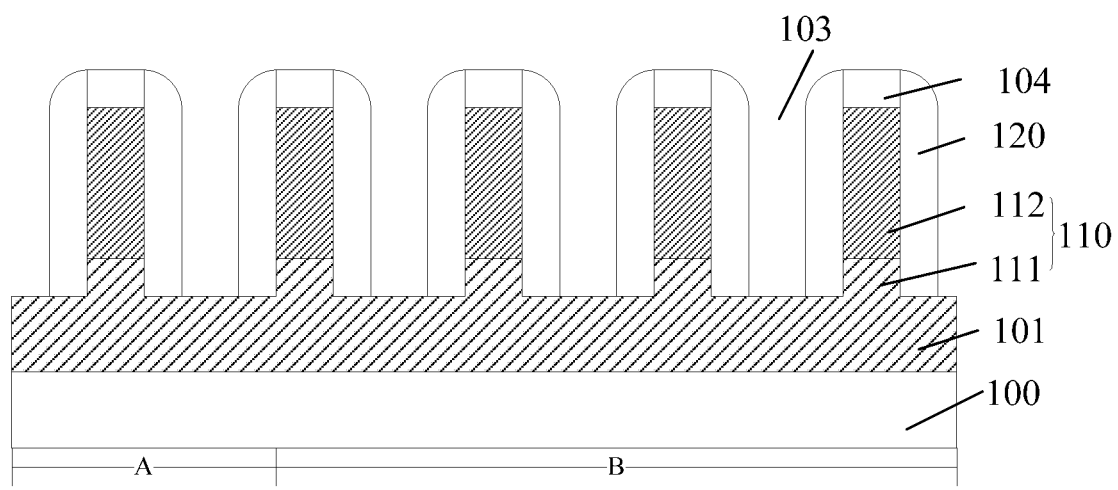

As illustrated in FIG. 2, sidewall spacers 102 may be formed on sidewalls of the first fins 110, to forming openings 103 from the initial openings 102 (e.g., Step S804 in FIG. 9).

The sidewall spacers 120 may be disposed in the initial openings 102.

The openings 103 may have a width smaller than a width of the initial openings 102, and may provide spaces for forming second fins.

The openings 103 may have a width of about 5 nm to about 10 nm.

In one embodiment, the sidewall spacers 120 may cover sidewalls of the first fins 110 and sidewalls of the barrier layers 103.

In one embodiment, the sidewall spacers 120 may be formed by: forming a sidewall spacer material layer on the barrier layers 104 of the first fins 110 and in the initial openings 102 to cover a portion of a surface of the lightly-doped fin material layer 101, the sidewalls of the first fins 110, the sidewalls and top surfaces of the barrier layers 104; and etching-back the sidewall spacer material layer 104 until exposing the top surfaces of the barrier layers 104, to form the sidewall spacers 102 on the sidewalls of the first fins 110 and the barrier layers 104.

The sidewall spacers 120 may be formed by a chemical vapor deposition method, a physical vapor deposition method, and/or an atomic layer deposition method.

In one embodiment, the sidewall spacers 120 may be formed by the chemical vapor deposition method.

The sidewall spacers 120 may be made of a material including amorphous carbon and/or amorphous silicon.

In one embodiment, the sidewall spacers 120 may be made of amorphous carbon. The sidewall spacers 120 may be removed later and a process for removing amorphous carbon may be easy.

The sidewall spacers 120 may define positions and a size of the second fins formed later. A distance between adjacent first fins 110 may be fixed, and the sidewall spacers 120 may be disposed on the sidewalls of the first fins 110. Correspondingly, a distance between the sidewall spacers 120 on the adjacent first fins 110 may define the width of the openings 103 in the adjacent sidewall spacers 103. The second fins may be formed in the openings 103. Correspondingly, a thickness of the sidewall spacers 120 may determine a size of the second fins.

The thickness of the sidewall spacers 120 may be about 5 nm to about 20 nm.

If the thickness of the sidewall spacers 120 is too large, the size of the second fins may be too small and the performance of the semiconductor device may be poor. If the thickness of the sidewall spacers 120 is too small, a distance between the second fins and the adjacent first fins 110 may be too small. First doped layers may be formed in the first fins and second doped layers may be formed in the second fins later. Correspondingly, the first doped layers and the second doped layers may be shorted easily.

Figure 3:
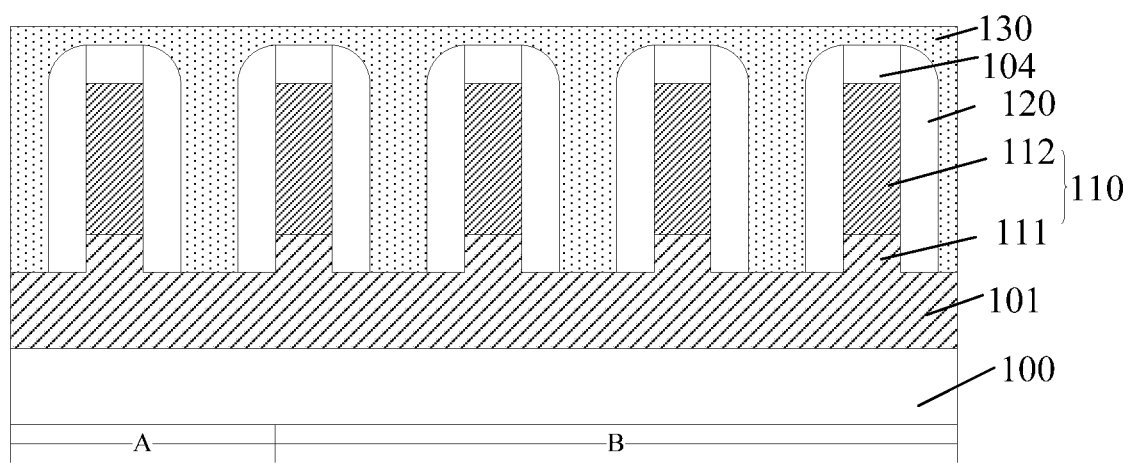

As illustrated in FIG. 3, a dielectric layer 130 may be formed in the openings 103 and covering the top surfaces of the first fins 110 (e.g., Step S806 in FIG. 9).

The dielectric layer 130 may provide a flat surface for forming a mask layer and a first pattern layer.

The dielectric layer 130 may be made of $SiO_2$, SiN, SiNO, SiCO, SiCN, SiCNO, or a combination thereof.

In one embodiment, the dielectric layer 130 may be made of $SiO_2$.

The dielectric layer 130 may be formed by: forming an initial dielectric layer on the base substrate to cover the first fins 210 and the sidewall spacers 120; and planarizing the initial dielectric layer to form the dielectric layer 130.

A process for planarizing the initial dielectric layer may make a surface of the dielectric layer 130 flat.

The initial dielectric layer may be formed by a deposition method including a fluid chemical vapor deposition method. The initial dielectric layer formed by the fluid chemical vapor deposition method may have a good filling performance.

Figure 4:
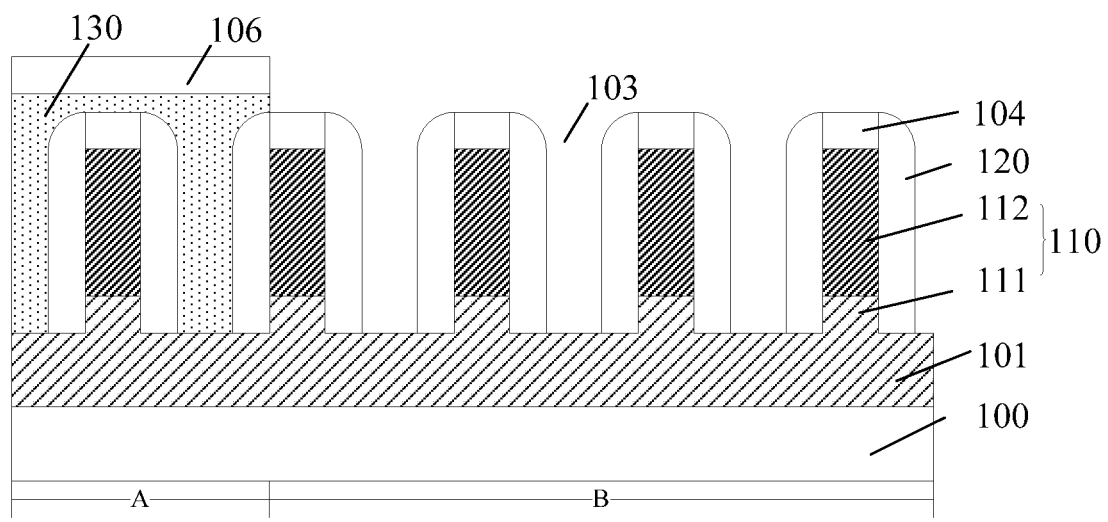

As illustrated in FIG. 4, a mask layer 106 may be formed on a first portion of the dielectric layer 130 in the first region A (e.g., Step S808 in FIG. 9).

The mask layer 106 may be formed by: forming a first pattern layer on a second portion of the dielectric layer 130 in the second region B; forming an initial mask layer on the first portion of the dielectric layer 130 in the first region A and on the first pattern layer; and removing the first pattern layer in the second region B and the initial mask layer, to form the mask layer 106.

The initial mask layer may be formed by a chemical vapor deposition method, a physical vapor deposition method, and/or an atomic layer deposition method.

In one embodiment, the initial mask layer may be formed by the chemical vapor deposition method.

The mask layer 106 may protect the first fins 110 in the first region A when processing the second region B.

The mask layer 106 may be made of SiN, SiNC, SiNB, SiCNO, SiNO, or a combination thereof.

In one embodiment, the mask layer 106 may be made of SiN.

As illustrated in FIG. 4, the second portion of the dielectric layer 130 in the second region B may be removed by using the mask layer 106 as a mask, to expose the openings 103 in the second region B (e.g., Step S810 in FIG. 9).

The openings 103 in the second region B may expose the sidewall spacers 120 in the second region B and the lightly-doped fin material layer 101 in the second region B.

The second portion of the dielectric layer 130 in the second region B may be removed by an anisotropic dry etching method.

The mask layer 106 may be made of a material different from a material of the dielectric layer 130. By using an etching gas with a large etching selection ratio between $SiO_2$ and SiN, the first portion of the dielectric layer 130 in the first region A may be protected when removing the second portion of the dielectric layer 130 in the second region B.

Figure 5:
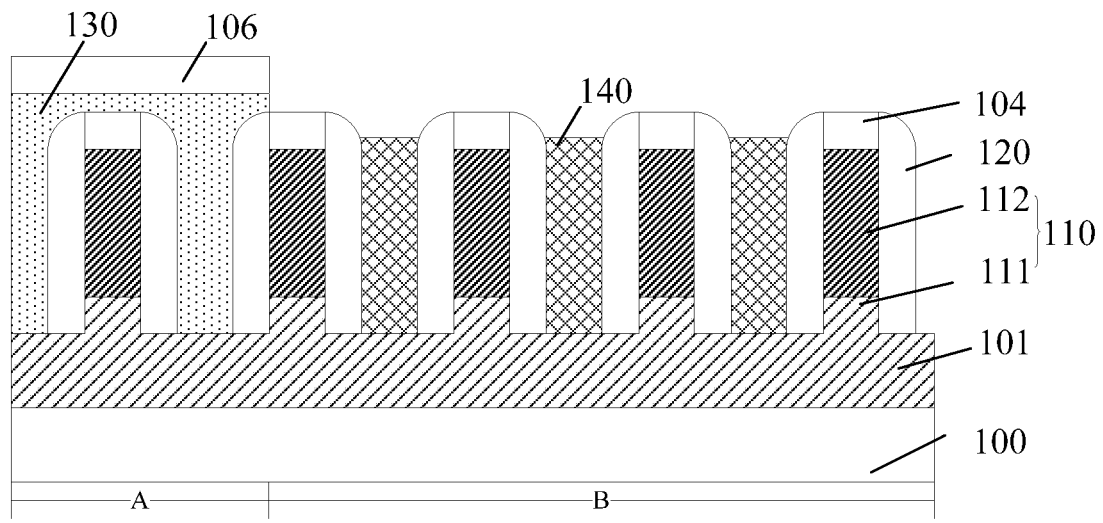

As illustrated in FIG. 5, a second fin 140 may be formed in each opening 103 in the second region B (e.g., Step S812 in FIG. 9).

In one embodiment, the second fins 140 may be made of single-crystalline silicon. In other embodiments, the second fins 140 may be made of SiGe.

The second fins 140 may be formed by an epitaxial growth method.

A distance between any two adjacent first fins 110 may be same. The sidewall spacers 120 may be formed on the sidewalls of the first fins 110 and the second fins 140 may be formed between the sidewall spacers 120 at the adjacent first fins 110 in the second region B. The sidewall spacers 120 may have same thickness, correspondingly a distance between each second fin 140 to an adjacent first fin 110 may be same. A size of the second fins 140 between adjacent first fins 110 may be controlled by the thickness of the sidewall spacers 120.

A height of the second fins 140 may be adjusted freely. The height of the second fins 140 and a height of the first fins 110 may be same or different.

Figure 6:
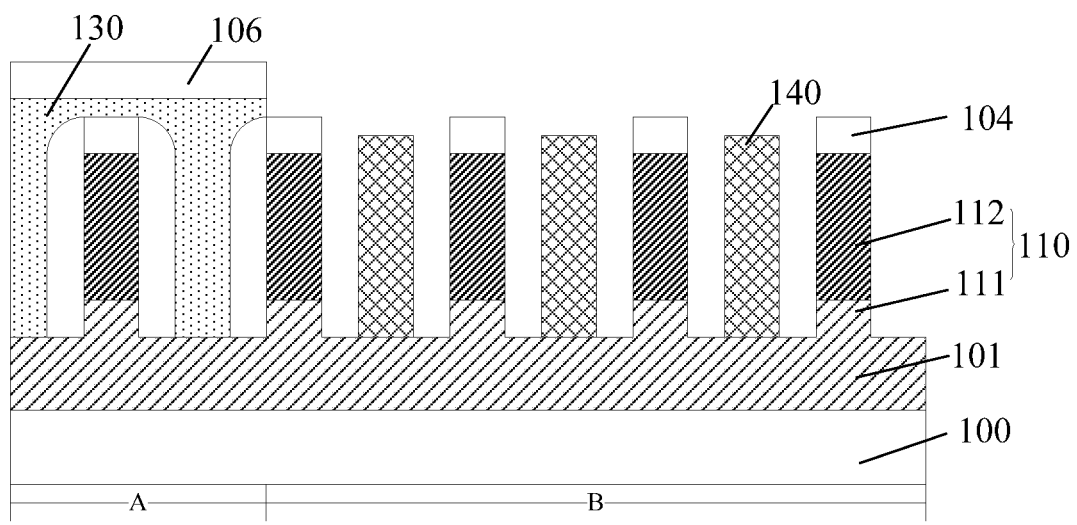

As illustrated in FIG. 6, the sidewall spacers 120 in the second region B may be removed after forming the second fins 140, to expose the sidewalls of the first fins 110 in the second region B and the sidewalls of the second fins 140 (e.g., Step S814 in FIG. 9).

In one embodiment, the sidewall spacers 120 may be made of amorphous carbon and the sidewall spacers 120 in the second region B may be removed by an ashing process.

The first fins 110 may be disposed in the first region A of the base substrate. The first fins 110 and the second fins 140 may be disposed in the second region B of the base substrate. The second fins 140 may be disposed between adjacent first fins 110 in the second region B and a distance between each second fin 140 to an adjacent first fin 110 may be same. The fins in the second region B of the base substrate may include the first fins 110 and the second fins 140, and correspondingly may have a high density. A fin array with a high density may be achieved and the performance of the semiconductor device may be improved.

The first fins 110 may be disposed in the first region A of the base substrate. The first fins 110 and the second fins 140 may be disposed in the second region B of the base substrate. Correspondingly, a density of the fins in the first region and a density of the fins in the second region may be different. Fin arrays with different density may be integrated and the performance of the semiconductor device may be improved.

In one embodiment, the first fins 110 in the second region B may be removed before removing the sidewall spacers 120 in the second region B.

As illustrated in FIG. 7, the first fins 110 in the second region B may be removed after removing the sidewall spacers 120 in the second region B (e.g., Step S816 in FIG. 9).

In one embodiment, the first region A may be used to form P-type transistors and the second region B may be used to form N-type transistors. In detail, the first region A may be used to form pull-up transistors and the second region B may be used to form pull-down transistors. The first fins 110 in the second region B may be removed to make the material of the fins in the first region A different from the material of the fins in the second region B.

In one embodiment, the barrier layer 104 may be disposed on the top of the first fins 110. Correspondingly, the barrier layer 104 on the top of the first fins 110 in the second region B may be removed before removing the first fins 110 in the second region B.

The first fins in the second region B may be removed completely, or only a portion of the first fins 110 in the second region B may be removed. The density of the fins in the second region B may be adjusted according to the function design.

In one embodiment, all the first fins in the second region B may be removed.

The first fins 110 in the second region B may be removed by a wet etching method, a dry etching method, or a combination thereof.

In one embodiment, the first fins 110 in the second region B may be removed by the wet etching method. An etching solution in the wet etching method may have a good etching selection ratio between silicon and SiGe, and a profile of silicon may be not affected when removing SiGe. The wet etching method for removing the first fins 110 in the second region B may use: an etching solution of HCl gas, a temperature of about 25° C. to about 300° C. The etching solution of HCl has a volume percentage of about 20% to about 90%.

As illustrated in FIG. 8, the mask layer 106 and the sidewall spacers 120 in the first region A may be removed to expose the top and the sidewalls of the first fins 110 in the first region A (e.g., Step S816 in FIG. 9).

In one embodiment, the mask layer 106 in the first region A, the dielectric layer 130 in the first region A, the barrier layers 104 in the first region A, and the sidewall spacers 120 in the first region A may be removed, to expose the top and the sidewalls of the first fins 110 in the first region A.

A distance between adjacent second fins 140 in the second region B may be a sum of a width of the first fins 110 and twice of the thickness of the sidewall spacers 120. The distance between adjacent second fins 140 in the second region B may be adjusted by changing the thickness of the sidewall spacers 120.

A distance between any two adjacent first fins 110 may be same. The sidewall spacers 120 may be formed on the sidewalls of the first fins 110 and the second fins 140 may be formed between the sidewall spacers 120 at the adjacent first fins 110 in the second region B. The sidewall spacers 120 may have same thickness, correspondingly a distance between each second fin 140 to an adjacent first fin 110 may be same. A size of the second fins 140 between adjacent first fins 110 may be controlled by the thickness of the sidewall spacers 120. A height of the second fins 140 may be adjusted freely. The height of the second fins 140 and a height of the first fins 110 may be same or different.

In one embodiment, after removing the mask layer 106 and the sidewall spacers 120 in the first region A, an isolation structure 160 may be formed on the lightly-doped fin material layer 101 to cover a portion of the sidewalls of the first fins 110 and a portion of the sidewalls of the second fins 140.

In some other embodiments, the isolation structure 160 may be disposed on the semiconductor substrate 100.

In one embodiment, the isolation structure 160 may cover a portion of the sidewalls of the first fins 110 in the first region A and a portion of the sidewalls of the second fins 140 in the second region B.

The present disclosure also provides a semiconductor device formed by the above methods. As illustrated in FIG. 6, the device may include: a base substrate including a first region A and a second region B adjacent to the first region A; first fins 110 on the base substrate in the first region A and on the base substrate in the second region B; initial openings between adjacent first fins 110; and second fins 140 in the initial openings in the second region B. A distance each second fin 140 and the first fins adjacent to two sides of a corresponding initial opening may be same.

The base substrate, a structure and positions of the first fins 110, a material and positions of the second fins 140 may be referred to the above descriptions.

In the present disclosure, the distance between adjacent first fins may be same. The sidewall spacers may be formed on the sidewalls of the first fins and the second fins may be disposed between the sidewall spacers among adjacent first fins in the second region. The thickness of the sidewall spacers may be same, and correspondingly, the distance between the second fins and adjacent first fins may be same. A size of the second fins between adjacent first fins may be adjusted by adjusting the thickness of the sidewall spacers, and the height of the second fins may be adjusted freely to make the height of the first fins same as or different from the height of the second fins. The first fins may be formed in the first region of the base subsrate, and the first fins and the second fins may be formed in the second region of the base substrate. Since the distance between the second fins and adjacent first fins may be same, the fins in the second region may include the first fins and the second fins, and may have a high density. The fin array with a high density may be achieved, and the performance of the formed semiconductor device may be improved.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments but may be embodied in other equivalent forms without departing from the scope of the present disclosure, which is determined by the appended claims.

What is claimed is:

1. A fabrication method for a semiconductor device, comprising:
    providing a base substrate, wherein the base substrate includes a first region, a second region adjacent to the first region;
    providing first fins on the first region and the second region of the base substrate, wherein initial openings are formed between adjacent first fins;
    forming sidewall spacers on sidewalls of the first fins in the initial openings, thereby forming openings; and
    forming second fins in the openings of the second region, wherein a distance between adjacent second fins on the second region equals a sum of a width of the first fins on the first region and twice of a thickness of the sidewall spacers.

2. The method according to claim 1, after forming the second fins in the openings of the second region, further including:
    removing the sidewall spacers in the second region to expose the sidewalls of the first fins in the second region and sidewalls of the second fins in the second region.

3. The method according to claim 1, wherein the sidewall spacers have a thickness of about 5 nm to about 20 nm.

4. The method according to claim 1, wherein:
the sidewall spacers are made of a material including amorphous carbon, amorphous silicon, or a combination thereof.

5. The method according to claim 4, wherein:
the sidewall spacers in the second region are removed by an ashing process.

6. The method according to claim 1, wherein forming the sidewall spacers includes:
forming a sidewall spacer material layer on the first fins and in the initial openings to cover the top surfaces and the sidewalls of the first fins; and
etching-back the sidewall spacer material layer until exposing the top surfaces of the first fins to form the sidewall spacers on the sidewalls of the first fins.

7. The method according to claim 1, wherein forming the second fins includes an epitaxial growth process.

8. The method according to claim 1, wherein the second fins are made of a material including single-crystalline silicon.

9. The method according to claim 1, wherein providing the first fins includes:
providing a semiconductor substrate;
forming a lightly-doped fin material layer on the semiconductor substrate;
forming a highly-doped fin material layer on the lightly-doped fin material layer;
forming a pattern layer on the highly-doped fin material layer; and
etching the highly-doped fin material layer and the lightly-doped fin material layer by using the pattern layer as a mask, to form the first fins.

10. The method according to claim 9, wherein:
the lightly-doped fin material layer is made of a material including silicon doped with germanium, wherein a molar volume percentage of germanium is about 10% to about 30%.

11. The method according to claim 1, wherein:
the highly-doped fin material layer is made of a material including silicon doped with germanium, wherein a molar volume percentage of germanium is about 20% to about 100%.

12. A fabrication method for a semiconductor device, comprising:
providing a base substrate, wherein the base substrate includes a first region, a second region adjacent to the first region;
providing first fins on the first region and the second region of the base substrate, wherein initial openings are formed between adjacent first fins;
forming sidewall spacers on sidewalls of the first fins in the initial openings, thereby forming openings;
forming a mask layer on the base substrate in the first region to cover top surfaces of the first fins in the first region;
forming second fins in the openings of the second region;
removing the sidewall spacers in the second region to expose the sidewalls of the first fins in the second region and sidewalls of the second fins in the second region; and
after removing the sidewall spacers in the second region, removing the mask layer in the first region and the sidewall spacers in the first region to expose the top surfaces and the sidewalls of the first fins in the first region.

13. The method according to claim 12, wherein:
before forming the mask layer, a dielectric layer is formed in the openings to cover the top surfaces of the first fins; and
forming the mask layer includes: forming a first pattern layer on the dielectric layer in the second region; forming an initial mask layer on the dielectric layer in the first region and on the first pattern layer; and removing the initial mask layer in the second region and the first pattern layer in the second region to form the mask layer.

14. The method according to claim 12, further including:
after removing the sidewall spacers in the second region and before removing the mask layer in the first region and the sidewall spacers in the first region, removing the first fins in the second region to expose the sidewalls of the second fins in the second region.

15. The method according to claim 12, further including:
before removing the sidewall spacers in the second region, removing the first fins in the second region to expose the sidewalls of the second fins in the second region.

16. The method according to claim 12, further including:
after removing the mask layer in the first region and the sidewall spacers in the first region, forming an isolation structure on the base substrate to cover a portion of the sidewalls of the first fins and a portion of the sidewalls of the second fins.

17. The method according to claim 12, further including:
forming a barrier layer on the top surface of each first fin;
forming the sidewall spacers on the sidewalls of the first fins and on the sidewalls of the barrier layers;
removing the sidewall spacers in the second region, the barrier layers in the second region, and the first fins in the second region, to expose the sidewalls of the first fins in the second region and the sidewalls of the second fins in the second region; and
removing the mask layer in the first region, the sidewall spacers in the first region, and the barrier layers in the first region, to expose the top surfaces and the sidewalls of the first fins in the first region.

18. A semiconductor device, comprising:
a base substrate including a first region and a second region adjacent to the first region;
first fins on the first region of the base substrate, wherein each first fin includes a lightly-doped fin layer on the base substrate and a highly-doped fin layer on the lightly-doped fin layer;
second fins on the second region of the base substrate, wherein a distance between adjacent first and second fins is greater than one or more of a distance between adjacent first fins and a distance between adjacent second fins, and the lightly-doped fin layer is made of a material including silicon doped with germanium, wherein a molar volume percentage of germanium is about 10% to about 30%.

19. The device according to claim 18, wherein:
the highly-doped fin layer is made of a material including silicon doped with germanium, wherein a molar volume percentage of germanium is about 20% to about 100%.

* * * * *